United States Patent [19]
Olson

[11] Patent Number: 6,022,416
[45] Date of Patent: Feb. 8, 2000

[54] POINT-OF-USE VAPORIZATION SYSTEM AND METHOD

[75] Inventor: Darin S. Olson, Menlo Park, Calif.

[73] Assignee: Novellus Systems, Inc., San Jose, Calif.

[21] Appl. No.: 09/065,385

[22] Filed: Apr. 23, 1998

[51] Int. Cl.[7] .................................................. C23C 16/00

[52] U.S. Cl. ............................ 118/726; 118/715; 261/142

[58] Field of Search ...................................... 118/715, 726; 261/142; 427/248.1, 255.23, 901

[56] References Cited

U.S. PATENT DOCUMENTS

| 5,312,509 | 5/1994 | Eschbach | 156/345 |
| 5,362,328 | 11/1994 | Gardiner et al. | 118/726 |
| 5,776,254 | 7/1998 | Yuuki et al. | 118/725 |

*Primary Examiner*—D. S. Nakarani
*Attorney, Agent, or Firm*—Roland Tso

[57] ABSTRACT

A point-of-use vaporization system for use in Chemical Vapor Deposition having a first delivery member for delivering a liquid precursor to a vaporization point, a second delivery member for separately delivering a solvent to the vaporization point, and a frit for vaporizing the precursor and solvent at the vaporization point.

30 Claims, 4 Drawing Sheets

POINT-OF-USE VAPORIZATION SYSTEM AND METHOD

BACKGROUND OF THE INVENTION

1. Field of the Invention

The present invention relates to point-of-use vaporization systems for use in Chemical Vapor Deposition (CVD). More particularly, the present invention relates to systems which deliver a precursor to a vaporization point.

2. The Background Art

Point-of use-vaporization systems are known in which a liquid precursor is delivered to a vaporization point in the vaporization systems in order to vaporize the liquid precursor for use in Chemical Vapor Deposition (CVD). In CVD devices, the components of the film must arrive at a substrate where they undergo a chemical reaction. In such point-of-use vaporization systems, the liquid precursors pass to a porous frit comprising a metal sponge, such as stainless steel, or a series of discs, or some other vaporization surface, where the precursors are vaporized due to heat in the system and the frit. Once vaporized, the corresponding gases pass from the frit into a shower head and onto a substrate, such as a silicon wafer. The shower head introduces other materials to the gases, such as an oxidizer or Nitrogen, which react with the precursors to cause the coating of a film onto the wafer. Inert materials may also be added in the shower head to tailor the resulting film.

Suitable precursors comprise organic metallics, such as tantalum pentaethe oxide, barium$(thd)_2$.polyamine, strontium$(thd)_2$Polyamine, or titanium$(O-iPr)_2(thd)_2$ which may be mixed with a suitable solvent, such as, for example, butyl acetate. The vaporized precursor and solvent then pass to a wafer where the precursor forms a film on the wafer.

However, it has been found that the flow of precursors to the vaporization point can not be readily started, stopped, and changed in such systems. This is due to particle formation of the precursor, since the precursor can dry out and form undesired particles as the flow of the precursor is stopped. These particles may clog the frit. Also, there has been difficulty due to clogging of the precursor line as a result of extreme particle formation in the precursor. Additionally, there can be "first injection" effects due to the precursor coming in contact with dry point-of-use vaporization hardware, which may also cause the formation of particles on the frit, and nonstable vaporization conditions, which can be detrimental to film properties and deposition stability.

Prior vaporization systems have a passageway between the frit and shower head to deliver gases from the frit to the shower head. Such vaporization systems also have a first valve in the passageway to control the flow of gases between the frit and shower head, and a second valve for controlling the passage of gases between the passageway and an exhaust. However, such valves and associated hardware have significantly increased the cost and bulk of such systems.

U.S. Pat. No. 5,362,328 relates to the direct flushing of a precursor line with a solvent.

SUMMARY OF THE INVENTION

A point-of-use vaporization system for use in Chemical Vapor Deposition including a first delivery member for delivering a liquid precursor to a vaporization point, and a second delivery member for separately delivering a solvent to the vaporization point. A frit is included for vaporizing the precursor and solvent at the vaporization point. The precursor and solvent are delivered separately to the frit, which results in the capability of starting, stopping, and changing the flow of the precursor to the vaporization point without the formation of particles by the precursor.

FEATURES AND ADVANTAGES OF THE INVENTION

A principal feature of the present invention is the provision of an improved point-of-use vaporization system.

The system of the present invention includes a first delivery member for delivering a liquid precursor to a vaporization point.

A feature of the invention is the provision of a second delivery member for separately delivering a liquid solvent to the vaporization point.

Another feature of the invention is that the precursor delivery member may separately deliver a plurality of different liquid precursors to the vaporization point.

A further feature of the invention is that the vaporization system eliminates the problem of particle generation due to the precursor drying out as the flow of the precursor is stopped, since the solvent keeps the vaporization point moist.

Yet another feature of the invention is that the vaporization system eliminates the problem of clogging due to extreme particle generation of the precursor.

Another feature of the invention is that the vaporization system eliminates the uncontrolled "first injection" effects otherwise due to the precursor coming in contact with dry point-of-use vaporization hardware, also the solvent keeps the vaporization point moist.

Still another feature of the invention is that the flow of the precursor may be readily started, stopped, or changed without adverse effects, such as particle formation, at the vaporization point.

A feature of the invention is that the vaporization system of the present invention eliminates a significant amount of hardware in the systems.

Thus, another feature of the invention is that the vaporization system of the present invention is of simplified construction and substantially reduced cost.

A further feature of the invention is that the precursor need only be delivered to the vaporization point when needed, thus maximizing chemical usage and decreasing costs.

Another feature of the invention is that the delivery of the solvent to the vaporization point may be continuous or intermittent.

A feature of the invention is that films may be deposited on a substrate such as a silicon wafer with a mix of a first precursor and a second precursor.

A further feature of the invention is that only the one precursor or only some other precursor may be deposited on the substrate to form a film on the substrate.

Another feature of the invention is that a tailored mix of two or more precursors may be deposited on the wafer, such as a deposit of 100% of the first precursor, and slowly changing the deposit to 100% of a second precursor which causes the film to start at one composition and end with another.

A feature of the invention is that the system permits the deposition of films on the wafer of the type which could not otherwise be formed on the wafer.

Another feature of the invention is that, the system permits the deposition of stacked films on the wafer comprising distinct layers of different films deposited on top of each other.

A feature of the invention is that since the supply of all precursors can be stopped, the delivery of a precise amount of precursor can take place with no intermixing of the precursors or adjacent layers in the film.

Another feature of the invention is that the embodiment of the delivery tubes for the precursors and solvent are such that all precursor and solvent hardware can remain moist at all times.

These and many other features and advantages of the present invention will become apparent to those of ordinary skill in the art from a consideration of the drawings and ensuing description of the invention.

DETAILED DESCRIPTION OF A PREFERRED EMBODIMENT

Those of ordinary skill in the art will realize that the following description of the present invention is illustrative only and not intended to be in any way limiting. Other embodiments of the invention will readily suggest themselves to such skilled persons.

Figure 1:
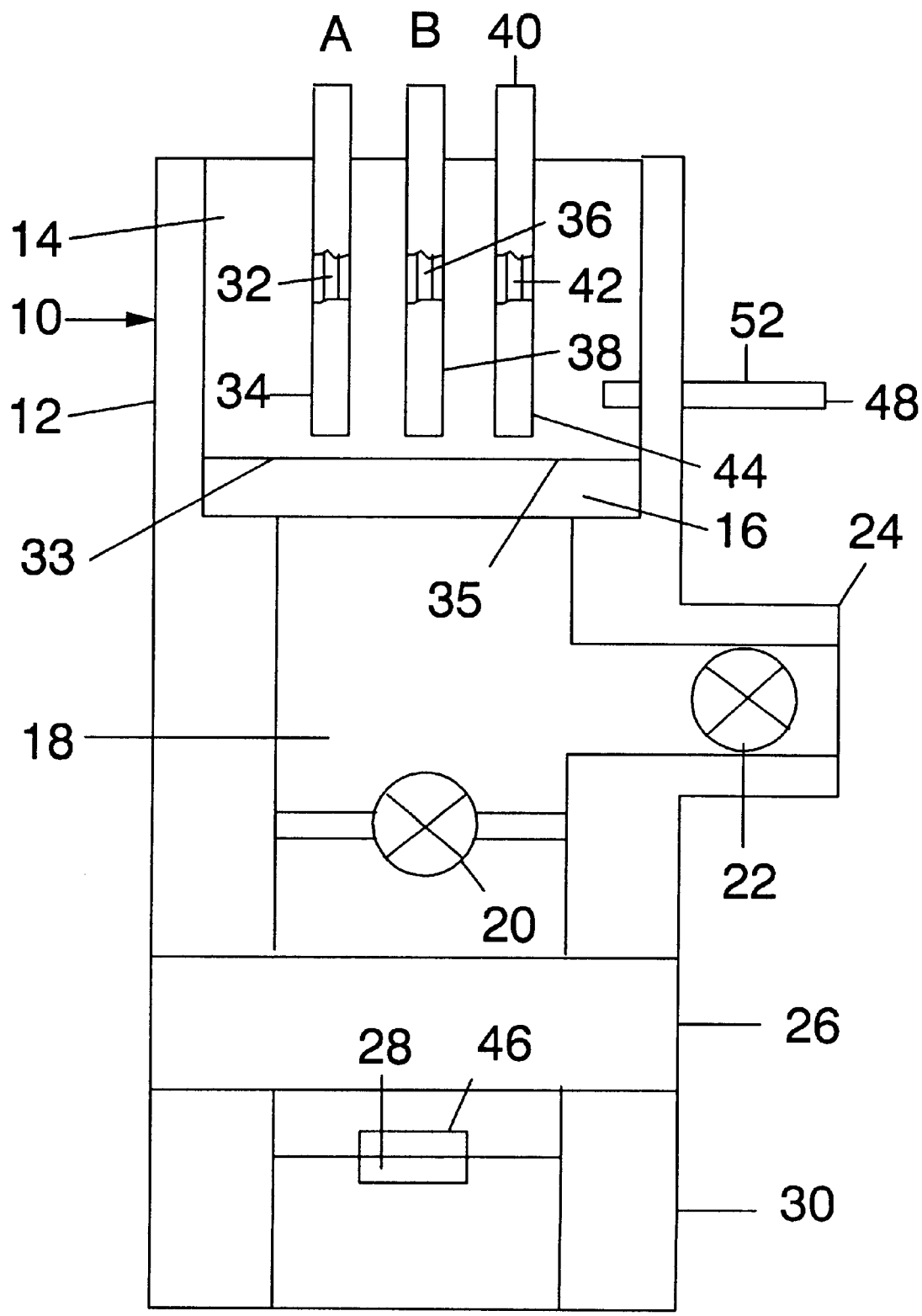
FIG. 1 is a diagrammatic view of a vaporization system in accordance with a presently preferred embodiment of the present invention.

Referring now to FIG. 1, there is shown a generic point-of-use vaporization system generally designated 10 of the present invention for use in Chemical Vapor Deposition (CVD). The system 10 has a wall 12 defining a chamber 14. The system 10 has a frit 16 extending across the chamber 14. The frit 16 may comprise a porous metal sponge, such as a porous stainless steel, or other vaporization system which is pervious to the passage of gas and/or liquid. The frit 16 communicates with a passageway 18, and a pair of first and second valves 20 and 22, with the second valve 22 communicating with an exhaust 24. The first valve 20 further communicates with a shower head 26, and thence with a substrate such as a wafer 28, which may be fabricated of silicon, to be treated.

As shown, a source A of a first precursor 32 is delivered through a first tube 34 to a location close to an upstream surface 33 of the frit 16 which defines a vaporization point 35. The first precursor 32 vaporizes as it passes through the frit 16, since the system 10 and frit 16 are heated to a temperature above the vaporization temperature of the first precursor 32. The system 10 may also have a source B of a second precursor 36 which is delivered through a second tube 38 to a location in close proximity to the same upstream surface 33 of the frit 16 at the vaporization point 35 where the second precursor 36 also vaporizes due to the heat. As shown, the system 10 also has a source 40 of a solvent 42 or more than one solvent which is delivered through a third tube 44 in close proximity to the upstream surface 33 of the frit 16 where it is also vaporized. In turn or together, the vaporizing gases pass through the frit 16 to the passageway 18 on the other side of the frit 16. The system 10 may use only one precursor, or a number of precursors greater than one, with each of the additional precursors also having suitable delivery tubes.

The chamber 14 may also have a source 48 of a gas or gases delivered through a tube 52 helping to push or carry the liquid precursors to and through the frit 16 and to the wafer 28.

The vaporized gases pass through the passageway 18 and first valve 20 when the first valve 20 is open and the second valve 22 is closed to the shower head 26 and onto the wafer 28 where the gaseous precursor forms a film 46 on the wafer 28. When it is not desired to pass the gases to the wafer 28, the first valve 20 is closed, and the second valve 22 is opened to permit the flow of the gases to the exhaust 24.

The precursors preferably comprise solid or liquid organo metallics, e.g., metal atoms bonded to organic molecules to stabilize the precursor. Suitable examples of the precursors are: tantalum pentaeth oxide, barium $(thd)_2$.Polyamine, strontium$(thd)_2$polyamine, or titanium$(O\text{-}iPr)_2(thd)_2$ which are contained in a suitable solvent, such as butyl acetate.

The system 10 may have an inert gas, such as argon, in the chamber 14 which sweeps the vaporized materials to the wafer 28. In the shower head 26 other materials, such as an oxidizer or Nitrogen, may be supplied to the vaporized gases to react with the precursors to cause coating of the film 46 on the wafer 28. In addition, the wafer 28 may be heated by a heater 30 to facilitate this result.

In accordance with the invention, the solvent 42 can be continuously delivered to the frit 16 through the third tube 44 in order to keep the frit 16 moist with the solvent 42, and in a condition ready to be used by the system 10. In prior devices, the second valve 22 is required until the vaporization stabilizes after starting the precursors. Since the frit 16 is always wet and capable of use due to the solvent 42, the second valve 22 may not be required in the system 10 of the invention, in addition to other hardware associated with the second valve 22 in the system 10. Additionally, first valve 20 may not be required. As a result, the system 10 is much lighter in weight than prior systems, and much less costly, such as $60,000 for the prior devices, compared with an estimated $2,000 for the system 10 of the invention. In addition, the frit 16 is much closer to the wafer 28, since the second valve 22 and hardware have been eliminated, as compared with prior systems, for improved results.

Thus, in accordance with the present invention, a plurality of suitable precursors are delivered to the vaporization point 35, and a solvent 42 is also delivered to the vaporization point 35. The flow of the solvent 42 may be continuous or intermittent, as desired.

The system 10 thus permits the delivery of the precursors to readily be started, stopped, or changed. This factor is only possible due to the separate supply of solvent, instead of delivering solvents inside the delivery tubes of the precursors. As a result, the precursors at the point of vaporization need only be delivered when needed, thus maximizing chemical usage and decreasing costs. The amount of separate solvent delivered should be the minimal amount required to keep the precursor delivery tubes and vaporization hardware wet and ready for use.

The system 10 also permits new types of control resulting in films on the wafer with designed properties. Films can be deposited with a mix of precursor A and precursor B, only precursor A or only precursor B, or a tailored mix of precursors A and B, such as starting with 100% precursor A and slowly changing to 100% precursor B, thus permitting the film to start at one composition and end with another. Such films would be virtually impossible to make in prior devices, since the devices need the ability to turn off one or the other, or both precursors. These different films may be deposited in rapid succession without the need to flush out any precursor lines prior to shutting off the flow, that is to deposit a film from precursor A, called film A, then precursor B, called film B, and then both A and B called film AB.

With the invention, the sequence would be to flow the separate solvent, flow the precursor A only when depositing film A, turn off the precursor A, flow the precursor B only when depositing film B, and flow the precursors A and B only when depositing the film AB. This factor greatly decreases the complexity and expense of depositing different films, and greatly reduces the reactor time used for depositing films.

Figure 2:
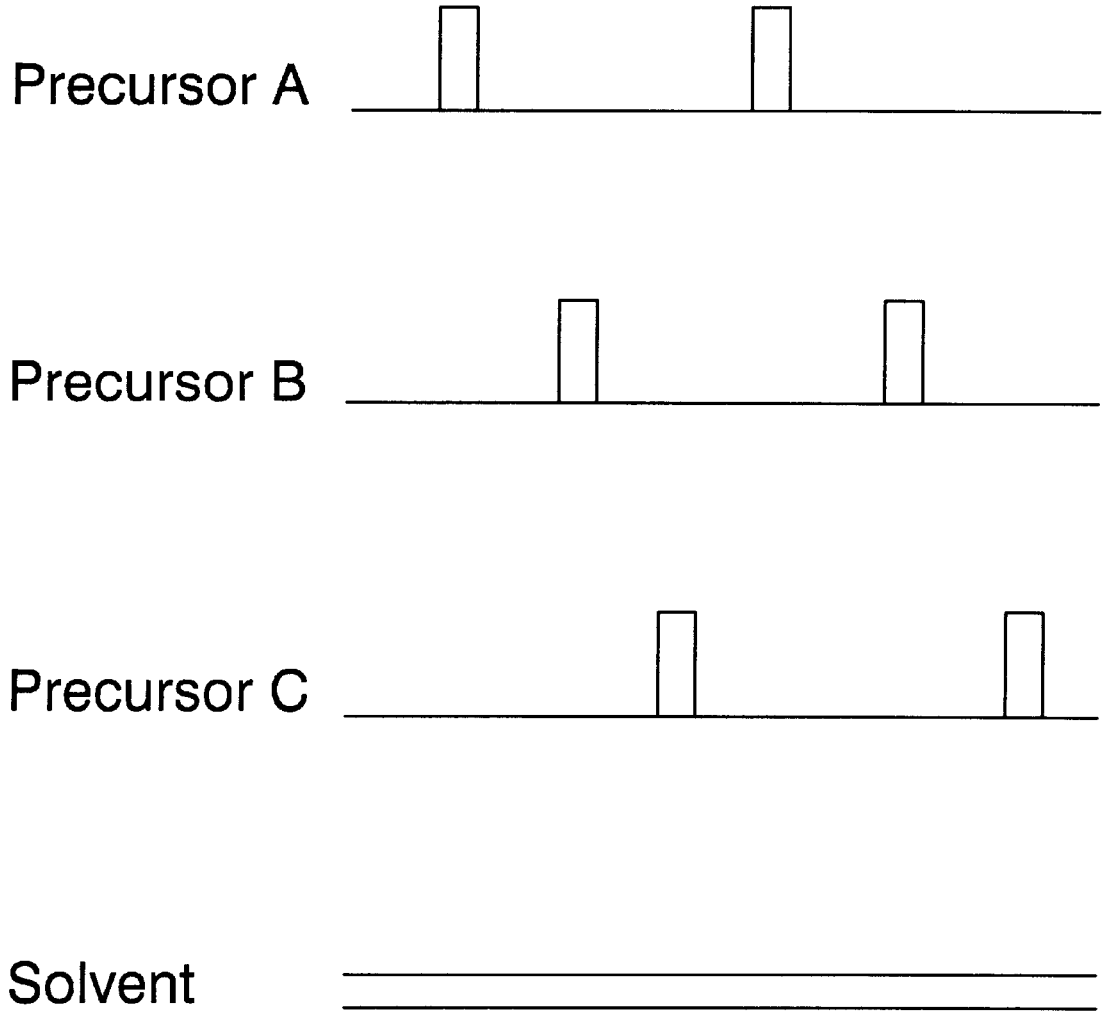
FIG. 2 is a chart showing possible precursor and solvent flows in the point-of-use vaporization system of FIG. 1 plotted against time.

The invention also permits the deposition of stacked films, comprising distinct layers of different films deposited on each other. The thinness of these layers would be limited by the smallest amount of precursor delivered. Since the supply of all precursors to the substrate can be stopped, the delivery of a precise amount of precursor can take place with no intermixing of the precursors from adjacent layers. With reference to FIG. 2, if a film A/B/C/A/B/C was desired, the delivery system 10 would act as shown in the drawing on the basis of time, showing the addition of another precursor C.

In a preferred form, the solvent flow rate is in the range of 0.05–0.2 milliliters per minute, the precursor flow rate is in the range of 0.01–0.2 milliliters per minute, and the carrier gas flow rate is in the range of 0.1–1 Liters per minute. The frit 16 is preferably approximately 1/16 inch thick, 3/4 inches in diameter, with an approximate 40 micron pore size. The length of the vaporization chamber 14 may be in the range of 1 inch to 4 inches. The preferred vaporizer operating temperature is in the range of 200 degrees Centigrade to 250 degrees Centigrade, which is greater than the boiling point of the precursor and solvent, and less than the decomposition point of the precursor and solvent.

In a preferred form, the precursor and solvent tubes 34 and 44 have an inside diameter in the range of 0.001–0.020 inches, and the carrier gas tube 52 is approximately 0.25 inches. The carrier gas is typically purified in order to remove $H_2O$ prior to injection into the vaporization system. The downstream ends of the precursor and solvent tubes 34 and 44 may be located slightly spaced from the frit, such as preferably 0.001 inches to 0.002 inches, in the embodiment as previously described, in contact with the frit 16 or embedded in the frit 16, which will be discussed below. Also, the downstream ends of the precursor tube and solvent tube 34 and 44 may be mechanically attached to the frit 16, or bonded to the frit 16.

In accordance with the invention, a method of vaporizing at a vaporization point of the invention has the steps: delivering a liquid precursor to the vaporization point, separately delivering a liquid solvent to the vaporization point, and vaporizing the precursor and solvent at the vaporization point.

Figure 3:
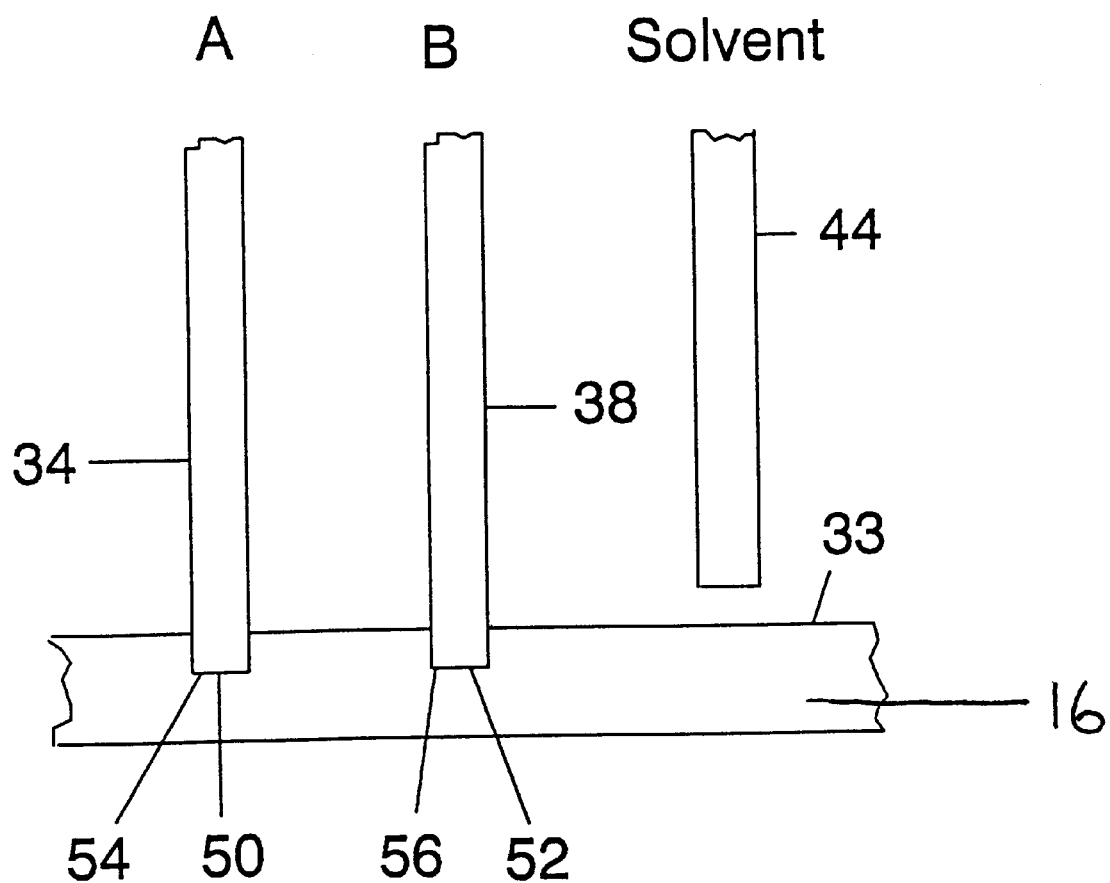
FIG. 3 is a diagrammatic view of an alternative embodiment of the present invention.

Another preferred embodiment of the invention is illustrated in FIG. 3, in which like reference numerals designate like parts. In this embodiment, the frit 16 has one or more recesses 50 and 52 in the upstream surface 33 of the frit 16. As shown, downstream ends 54 and 56, respectively, of the first and second tubes 34 and 38 are mechanically received in the recesses 50 and 52, along with the third tube 44 to deliver the solvent which keeps the frit 16 wet. In this form, additional assurance is given that the precursors corresponding to the first and second tubes 34 and 38 will remain moist in order to prevent formation of particles which may otherwise clog the frit 16.

Figure 4:
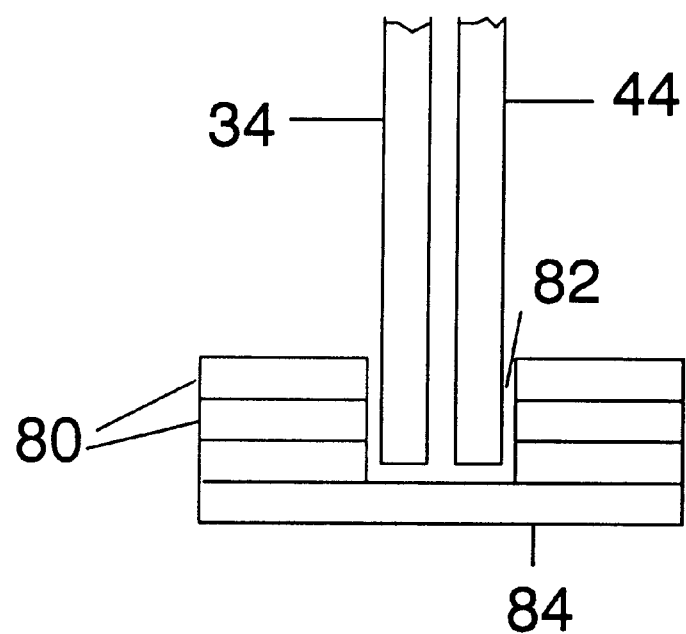
FIG. 4 is a diagrammatic view of an alternate embodiment of the present invention.

Another preferred embodiment of the present invention is illustrated in FIG. 4, in which like reference numerals designate like parts. In this embodiment, the vaporization systems may have a plurality of stacked discs 80, such as inert metal discs. In a preferred form, the system may have 10 to 100 of such stacked discs.

As shown, the upstream portion of the discs 80 may have a recess 82 to receive the downstream ends of the precursor tube 34, and solvent tube 44. The downstream end of the stack may have a disc 84 which closes a downstream end of the recess 82. The carrier gas may also be supplied to the recess 82.

In use, the carrier gas forces the precursor and solvent out of the disc stack between the surfaces of the discs 80, with the discs 80 supplying a large vaporization surface for the precursor and solvent. In other respects, the system of FIG. 4 operates substantially the same as the system previously described in connection with FIG. 1.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A point-of-use vaporization system, comprising:
    a first delivery member for delivering a liquid precursor to a vaporization point;
    a second delivery member for separately delivering a liquid solvent to the vaporization point; and
    a frit for vaporizing the precursor and solvent at the vaporization point.

2. The system of claim 1 wherein the precursor delivery member comprises a tube.

3. The system of claim 2 wherein the precursor delivery member comprises a plurality of tubes for delivering a plurality of separate precursors to the vaporization point.

4. The system of claim 3 wherein the frit has a plurality of recesses in a surface of the frit, and in which a downstream end of the tubes are received in the recesses.

5. The system of claim 1 wherein the solvent delivery member comprises a tube.

6. The system of claim 1 including a wall defining a chamber, with a downstream end portion of the first and second delivery members being located in said chamber.

7. The system of claim 6 including a third delivery member for introducing a sweeping gas to said chamber.

8. The system of claim 1 wherein the solvent is continuously delivered to the frit.

9. The system of claim 1 wherein the frit is heated.

10. The system of claim 1 including a shower head for adding materials to the vaporized gas, and a passageway communicating between the frit and shower head.

11. The system of claim 10 including a valve in the passageway to control the passage of gas between the frit and shower head.

12. The system of claim 10 wherein the passageway directly communicates between the frit and shower head.

13. The system of claim 10 wherein said passageway is closed between the frit and shower head.

14. A point-of-use vaporization system, comprising:
    a first delivery member for delivering a liquid precursor to a vaporization point; and a second delivery member for delivering a solvent to a frit for starting, stopping, and changing the flow of the precursor to the vaporization point without flushing the first delivery member with a solvent.

15. A point-of-use vaporization system, comprising:

a first tube for delivering a liquid precursor to a vaporization point defined by a heated frit; and a second tube for delivering a separate solvent to the vaporization point on the frit, with said heated frit causing vaporization of the precursor and solvent.

16. The system of claim 15 including a plurality of tubes having downstream ends close to the vaporization point for delivering a plurality of different precursors or solvents to the vaporization point.

17. A point-of-use vaporization system, comprising:

a first delivery member for delivering a liquid precursor to a vaporization point;

a second delivery member for separately delivering a liquid solvent to the vaporization point; and a plurality of stacked discs having a recess in an upstream portion of the discs, with a downstream end of the discs being closed, and with a downstream end of the first and second delivery members being received in said recess.

18. The system of claim 17 in which the first and second delivery members comprise tubes, with a downstream end of the tubes being received in the recess.

19. A point-of-use vaporization system, comprising:

a wall defining a chamber;

a porous frit in the chamber;

a delivery member for delivering a carrier gas to the chamber;

a first tube for delivering a liquid precursor to the frit, said first tube having a downstream end in the chamber; and a second tube for delivering a liquid solvent to the frit, said second tube having a downstream end located in the chamber.

20. The system of claim 19 wherein at least one of said tubes is spaced slightly from the frit.

21. The system of claim 20 wherein the downstream end of said one tube is spaced 0.001 inches to 0.002 inches from the frit.

22. The system of claim 19 wherein the downstream end of at least one of said tubes is in contact with the frit.

23. The system of claim 19 wherein the downstream end of at least one of the tubes is embedded in the frit.

24. The system of claim 19 wherein the delivery member comprises a third tube.

25. The system of claim 24 wherein the inside diameter of the third tube is approximately 0.25 inches.

26. The system of claim 19 wherein the flow rate of the precursor is in the range of 0.01–0.2 milliLiters per minute, the flow rate of the solvent is in the range of 0.05–0.2 milliLiters per minute, and the flow rate of the carrier gas is in the range of 0.1–1 Liters per minute.

27. The system of claim 19 wherein the operating temperature of the system is in the range of 200 degrees Centigrade to 250 degrees Centigrade.

28. The system of claim 19 wherein the inside diameter of at least one of said tubes is in the range of 0.001 inches to 0.020 inches.

29. The system of claim 19 wherein the length of the chamber is in the range of inch to 4 inches.

30. The system of claim 19 wherein the thickness of the frit is approximately 1/16 inches, the diameter of the frit is approximately 3/4 inches, and in which the pore size of the porous frit is approximately 40 microns.

* * * * *